(12) United States Patent
Chen et al.

(10) Patent No.: US 11,201,059 B2
(45) Date of Patent: Dec. 14, 2021

(54) DEVICE HAVING WORK FUNCTION METAL STACK AND METHOD OF FORMING THE SAME

(71) Applicant: TAIWAN SEMICONDUCTOR MANUFACTURING CO., LTD., Hsinchu (TW)

(72) Inventors: Yen-Yu Chen, Kaohsiung (TW); Yu-Chi Lu, Hsinchu (TW); Chih-Pin Tsao, Hsinchu County (TW); Shih-Hsun Chang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 51 days.

(21) Appl. No.: 16/701,009

(22) Filed: Dec. 2, 2019

(65) Prior Publication Data

US 2020/0105533 A1 Apr. 2, 2020

Related U.S. Application Data

(63) Continuation of application No. 15/965,635, filed on Apr. 27, 2018, now Pat. No. 10,497,571.

(51) Int. Cl.
*H01L 21/28* (2006.01)
*H01L 29/49* (2006.01)

(52) U.S. Cl.
CPC .. *H01L 21/28088* (2013.01); *H01L 21/28185* (2013.01); *H01L 29/4966* (2013.01)

(58) Field of Classification Search
CPC ......... H01L 21/28088; H01L 21/28185; H01L 29/4966
USPC .......................................................... 257/288
See application file for complete search history.

(56) References Cited

U.S. PATENT DOCUMENTS

| | | | |
|---|---|---|---|
| 10,304,835 B1* | 5/2019 | Tsai | H01L 21/02318 |
| 2015/0179640 A1* | 6/2015 | Kim | H01L 21/823842 |
| | | | 257/392 |
| 2015/0214112 A1 | 7/2015 | Zhao | |
| 2015/0239015 A1 | 8/2015 | Asari et al. | |
| 2016/0086946 A1* | 3/2016 | Yin | H01L 21/823821 |
| | | | 257/369 |
| 2017/0365479 A1 | 12/2017 | Zhao | |
| 2018/0145149 A1* | 5/2018 | Chiang | H01L 29/517 |
| 2019/0139759 A1* | 5/2019 | Cheng | H01L 29/517 |

\* cited by examiner

*Primary Examiner* — Igwe U Anya
(74) *Attorney, Agent, or Firm* — Maschoff Brennan

(57) ABSTRACT

A method includes removing a dummy gate to form a gate trench. A gate dielectric layer is deposited over a bottom and sidewalls of the gate trench. A first work function metal layer is deposited over the gate dielectric layer. A dummy layer is deposited over the first work function metal layer. An impurity is introduced into the dummy layer and the first work function metal layer after the dummy layer is deposited. The dummy layer is removed after the impurity is introduced into the dummy layer and the first work function metal layer. The gate trench is filled with a conductive material after the dummy layer is removed.

20 Claims, 15 Drawing Sheets

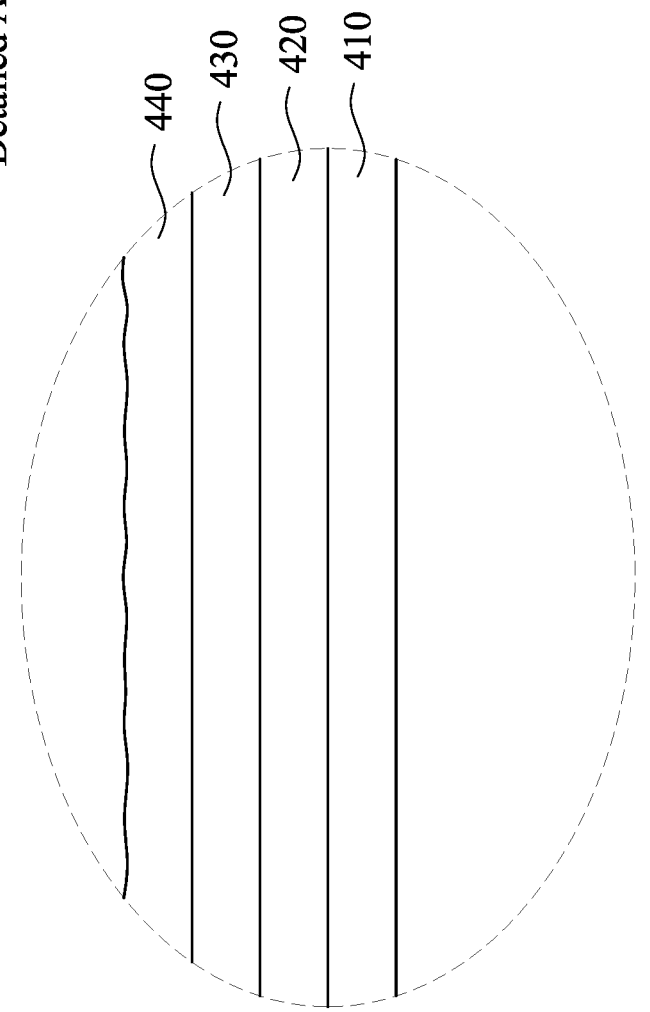

DEVICE HAVING WORK FUNCTION METAL STACK AND METHOD OF FORMING THE SAME

PRIORITY CLAIM AND CROSS-REFERENCE

This application is a continuation of U.S. patent application Ser. No. 15/965,635, filed Apr. 27, 2018, now U.S. Pat. No. 10,497,571, issued Dec. 3, 2019, which are herein incorporated by reference in its entirety.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

To further improve a performance of a semiconductor device, a work function of a metal gate stack of the semiconductor device may be adjusted. In some instances, the adjustment is performed by depositing several work function metal layers having different materials and/or removing a portion of the work function metal layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4C' is a cross-sectional view of intermediate stage showing an implanting operation in accordance with some embodiments of the present disclosure.

FIG. 4D' is a partially enlarged view of FIG. 4D.

DETAILED DESCRIPTION

Figure 1:
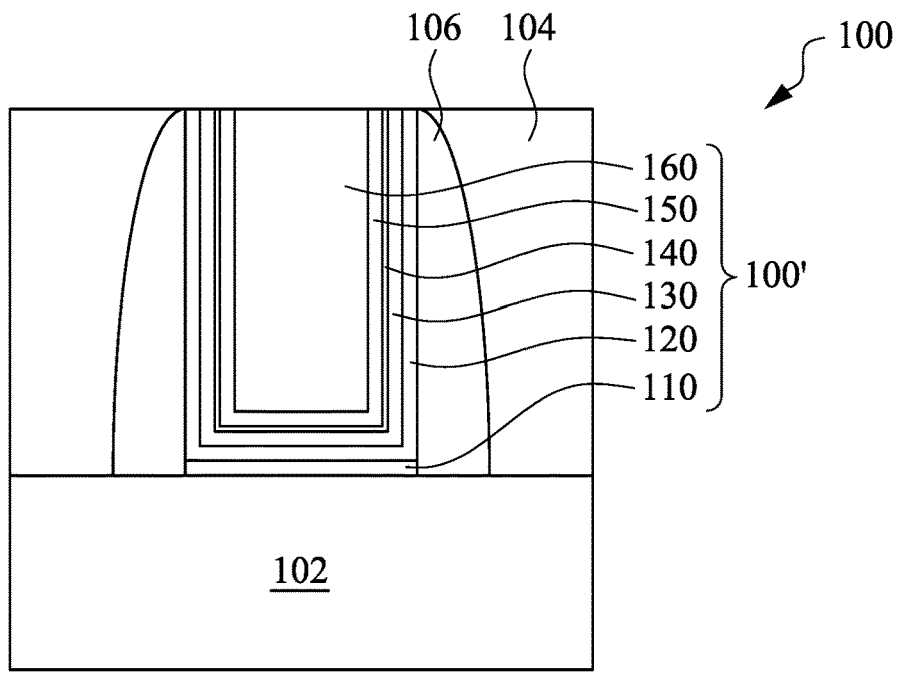
FIG. 1 is a schematic cross-sectional view showing a device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The spatially relative terms are intended to encompass different orientations of the structure in use or operation in addition to the orientation depicted in the figures. The apparatus may be otherwise oriented (rotated 90 degrees or at other orientations) and the spatially relative descriptors used herein may likewise be interpreted accordingly.

A metal gate stack mainly includes a dielectric layer, plural work function metal layers on the dielectric layer, and a gate electrode on the work function metal layers. In pursuit of less device defects, a higher yield and a better device performance of a semiconductor device, various operations may be performed before, during and/or after a metal gate stack formation scheme. For example, one or more work function metal materials may be deposited and patterned over the dielectric layer, thereby forming the metal work function layers of the metal gate stacks. Some impurities may be introduced into one or more metal work function layers to further adjust a work function of the work function metal layers. Introducing the impurities may be performed by depositing a work function adjusting layer on the metal work function layer, annealing the substrate to diffuse the impurities of the work function adjusting layer into work function metal layers underlying the work function adjusting layer, and removing the work function adjusting layer. The work function metal layer directly underlying the work function adjusting layer may be used as a protective layer, when one or more etching operations are performed to remove the work function adjusting layer, so as to prevent damages of the underlying features (e.g. the other work function metal layer and/or the dielectric layer). Optionally, introducing the impurities is performed by implanting the impurities into one or more work function metal layers.

However, the work function metal layer directly underlying the work function adjusting layer or directly contacting the implanting source has a high risk of a structure loss (or damage) resulted from the etching operations or the implanting operation. When the damaged work function metal layer remains in the metal gate stack, serious device defects (e.g. a N/P boundary concern of the semiconductor device, impacts on a threshold voltage ($V_t$) and yielding of the semiconductor device) may occur. Furthermore, the damage of the work function metal layer may become worse when the manufacturing process of the metal gate stack goes further.

Embodiments of the present disclosure are directed to providing a device and a method of forming the same, in which the device includes plural work function metal layers. One aspect of the embodiments of the present disclosure is to remove the damaged work function metal layer and re-deposit a new work function metal layer. In some embodiments, the re-deposited work function metal layer has similar composition to the removed one. In at least one embodiment, during removing the damaged work function metal layer, a tungsten (W)-containing residue remains, and the W-containing residue may be referred to as an evidence that the removing operation and the re-deposition operation has been performed. The method of forming the device of the present disclosure provides various benefits, such as no need of an additional mask, being compatible to a current semiconductor manufacturing process, an enough strength of the re-deposited work function layer for subsequent patterning processes, and less device defects, so as to form the semiconductor device having a higher yielding and a better performance.

In some embodiments, the semiconductor device mentioned above may include a metal-oxide semiconductor field effect transistor (MOSFET), a fin field effect transistor (FinFET), a tunnel field-effect transistor (T-FET), a device having nanowire channels, a planar semiconductor device and the like. The scope of the present disclosure may be applied to a variety of the semiconductor devices, and may not be limited to the examples shown in the present disclosure.

Referring to FIG. 1, FIG. 1 is a schematic cross-sectional view showing a device 100 in accordance with some embodiments of the present disclosure. As shown in FIG. 1, the device 100 includes a substrate 102, an interlayer dielectric (ILD) layer 104, gate spacers 106 and a metal gate stack 100'. The ILD layer 104 is disposed on the substrate 102, and the gate spacers 106 and the metal gate stack 100' are disposed in the ILD layer 104. The gate spacers 106 are disposed on sidewalls of the metal gate stack 100'. The metal gate stack 100' includes an interfacial layer 110, a dielectric layer 120, a first work function metal layer 130, an intermediate layer 140, a second work function metal layer 150 and a metal gate electrode 160. The interfacial layer 110 is disposed over the substrate 102 and at the bottom of the metal gate stack 100'. The dielectric layer 120 is disposed over the interfacial layer 110. The first work function metal layer 130 is disposed over the dielectric layer 120. The intermediate layer 140 is disposed over the first work function metal layer 130. The second work function metal layer 150 is disposed over the intermediate layer 140. The metal gate electrode 160 is disposed over the second work function metal layer 150. The dielectric layer 120, the first work function metal layer 130, the intermediate layer 140 and the second work function metal layer 150 peripherally surround the metal gate electrode 160. In some embodiments, the device 100 may have 3, 4, 5 or 6 work function (WF) layers. In addition, both p-type and n-type WF layers may be included in an n-type FET; and, both p-type and n-type WF layers may be included in a p-type FET.

In some embodiments, the substrate 102 may be a silicon substrate. In other embodiments, the substrate 102 may alternatively include germanium, other III-V elements and/or their compounds such as silicon germanium, gallium arsenic, or any other suitable semiconductor materials. In a further embodiment, the substrate 102 may include other features such as various doped regions such as p-wells or n-wells, a buried layer, and/or an epitaxy layer. Furthermore, the substrate 102 may be a semiconductor on insulator such as silicon on insulator (SOI). In other embodiments, the semiconductor substrate 102 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

In some embodiments, the ILD layer 104 may include flowable oxide. The ILD layer 104 may also be a spin-on glass. For example, the ILD layer 104 may include phospho-silicate glass (PSG), boro-silicate glass (BSG), boron-doped phospho-silicate glass (BPSG), tetraethyl orthosilicate (TEOS) oxide, TiN, SiOC, or other dielectric materials.

In some embodiments, the gate spacers 106 are formed of silicon oxide, silicon nitride, silicon carbon nitride, or the like. Furthermore, the gate spacers 106 may have a multilayer structure, for example, with a silicon nitride layer over a silicon oxide layer. In some embodiments, the interfacial layer 110 includes an oxide layer such a silicon oxide layer.

In some embodiments, the dielectric layer 120 is a high-k dielectric layer. In one example, a material of the high-k dielectric layer may include but is not limited to hafnium oxide ($HfO_x$), LaO, AlO, ZrO, TiO, $Ta_2O_5$, $Y_2O_3$SrTiO$_3$ (STO), BaTiO$_3$ (BTO), BaZrO, HfZrO, HfZrON, HfLaO, HfSiO, HfSiON, LaSiO, AlSiO, HfTaO, HfTiO, (Ba,Sr)TiO$_3$ (BST), $Al_2O_3$, $Si_3N_4$, oxynitrides, or other suitable materials, where x>0.

In some embodiments, the first work function metal layer 130 and the second work function metal layer 150 includes different work function metals. In some embodiments, the first work function metal layer 130 includes TiN, $TiNO_y$, $TaNO_y$, Al-doped TiN, or a combination thereof, in which y>0. In other examples, the second work function metal layer 150 may include TaN, W or a nitride compound containing Ti and Ta. In some embodiments, a thickness of each of the first work function metal layer 130 and the second work function metal layer 150 is in a range from about 5 Å to about 25 Å. In some embodiments, the second work function metal layer 150 is in a range from about 5 Å to about 15 Å. A target work function depends on the thickness of the first and second work function metal layers 130 and 150, and can be modified according to requirements of a semiconductor device.

In some embodiments, the intermediate layer 140 may include a compound different from the first work function metal layer 130, such as a nitride compound of aluminum, tungsten, tantalum, or titanium. In some embodiments, the intermediate layer 140 includes at least one of a binary, ternary, and quaternary tungsten compound. For example, the compound of tungsten may include, but is not limited to, tungsten chloride, tungsten oxide, or a combination thereof which are formed by a residue or a byproduct of a removed work function metal layer. In some embodiments, the intermediate layer 140 may further include a compound of W and TiN, TaN, TiNOX and/or $TaNO_x$ which may come from a portion of the removed work function metal layer, and x>0. In some embodiments, the intermediate layer 140 has a thickness in a range from about 3 Å to about 10 Å. A greater thickness increases the difficulty of subsequent filling process, in some instances. A smaller thickness would damage the underlying layers, in some instances. Details will be described later. In some embodiments, the intermediate layer 140 is detectable under ZC-mode of an electron microscope image, such as a transmission electron microscope (TEM), in which the intermediate layer 140 is relatively thin and is presented in an interface between two work function metal layers (e.g. between the first work function metal layer 130 and the second work function metal layer 150). In some embodiments, the intermediate layer 140 includes a same material as the first work function metal layer 130. In some embodiments, the metal gate electrode 160 may include a conductive material, such as aluminum, tungsten, copper.

Figure 2:
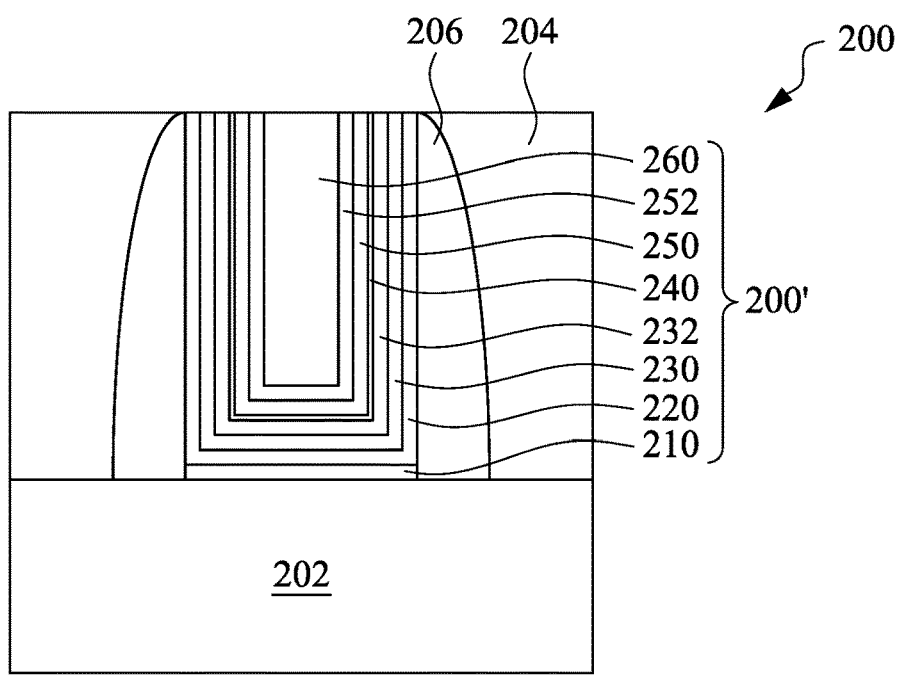
FIG. 2 is a schematic cross-sectional view showing a device in accordance with other embodiments of the present disclosure.

Referring to FIG. 2, FIG. 2 is a schematic cross-sectional view showing a device 200 in accordance with other embodiments of the present disclosure. As shown in FIG. 2, the device 200 includes a substrate 202, an ILD layer 204, gate spacers 206 and a metal gate stack 200'. The substrate 202, the ILD layer 204 and the gate spacers 206 are similar to the substrate 102, the ILD layer 104 and the gate spacers 106. The metal gate stack 200' includes an interfacial layer 210, a dielectric layer 220, two first work function metal layers 230 and 232, an intermediate layer 240, a second work function metal layer 250, a third work metal function 252 and a metal gate electrode 260. The interfacial layer 210, the dielectric layer 220, the intermediate layer 240, the second work function metal layer 250 and the metal gate electrode 260 are similar to the interfacial layer 110, the dielectric layer 120, the intermediate layer 140, the second work function metal layer 150 and the metal gate electrode 160. In some embodiments, each of the first work function metal layers 230 and 232 may have the similar composition to the first work function metal layer 130 described in FIG. 1, and the first work function metal layers 230 may be same as or different from the first work function metal layers 232. In some embodiments, the third work function metal layer 252 include a p-type work function metal similar to the first work function metal layer 130 or the second work function metal layer 150 described in FIG. 1. In other embodiments, the third work function metal layer includes an n-type work function metal such as aluminum (Al) and a compound of aluminum, e.g. aluminum oxide, aluminum nitride and any other suitable compounds. In some embodiments, a thickness of each of the first work function metal layers 230 and 232, the second work function metal layer 250 and the third work function metal layers 252 is in a range from about 5 Å to about 25 Å. In some embodiments, the second work function metal layer 250 is in a range from about 5 Å to about 15 Å.

From the embodiments shown in FIG. 2, the relative location (among the other work function metal layers) of the intermediate layer 240 is not fixed, and the relative location of the intermediate layer 240 may be adjusted depending on the configuration or the design of the semiconductor device. The examples provided in the figures are not intended to limit the relative location of the intermediate layer, but only shown for clear understanding of the present disclosure. A skilled person in the art may easily adjust the numbers of the first and third work function metal layers according to the requirements or the design of the device.

Figure 3:
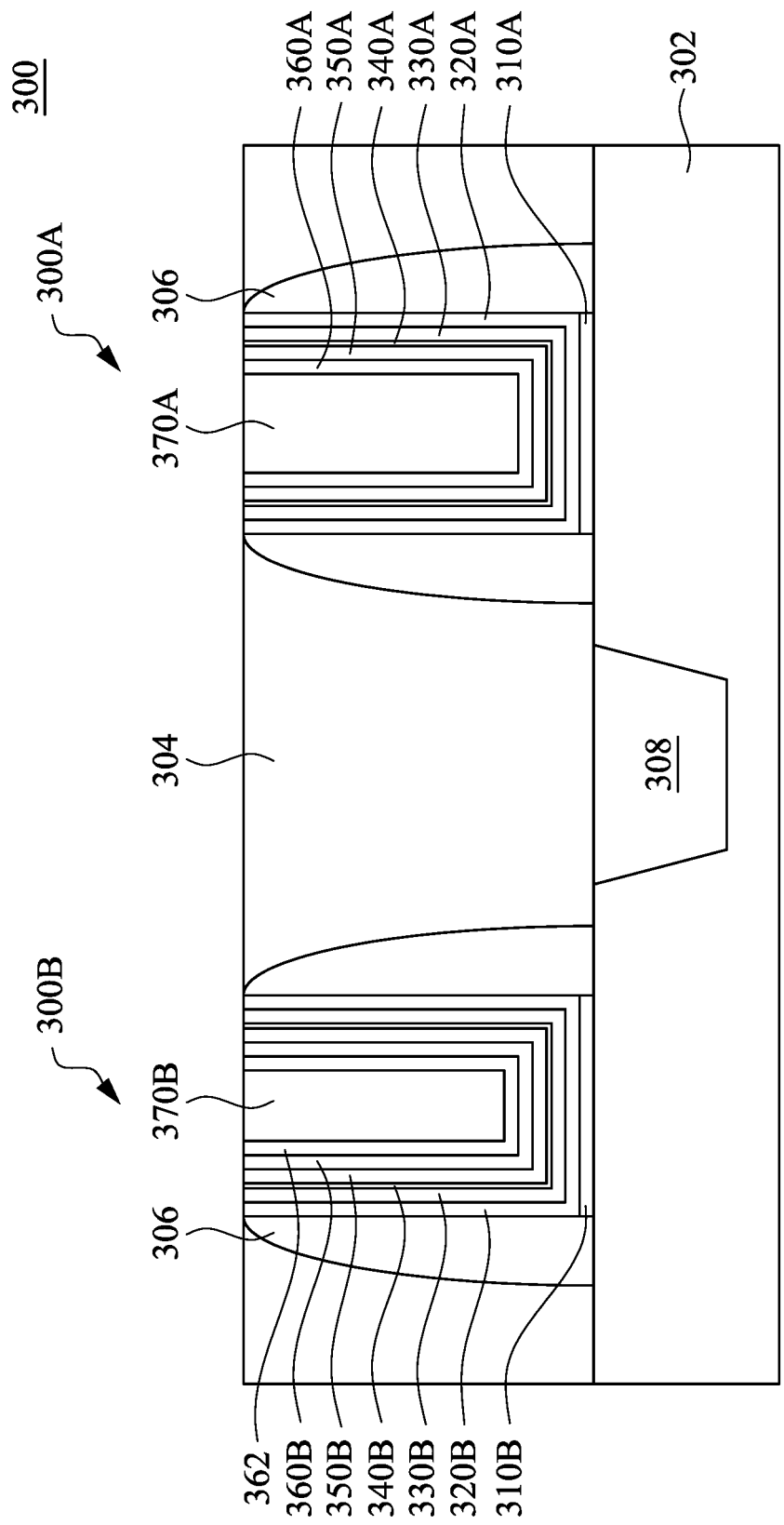
FIG. 3 is a schematic cross-sectional view showing a device in accordance with further embodiments of the present disclosure.

Referring to FIG. 3, FIG. 3 is a schematic cross-sectional view showing a device 300 in accordance with further embodiments of the present disclosure. In FIG. 3, the device 300 includes a substrate 302, an interlayer dielectric layer 304, gate spacers 306, a metal gate stack 300A and a metal gate stack 300B. The substrate 302, the ILD layer 304 and the gate spacers 306 are similar to the substrate 102, the ILD layer 104 and the gate spacers 106, in which a shallow trench isolation (STI) 308 is disposed in the substrate 302 and between the metal gate stack 300A and the metal gate stack 300B. Interfacial layers 310A and 310B, dielectric layers 320A and 320B, first work function metal layers 330A and 330B, intermediate layers 340A and 340B, second work function metal layers 350A and 350B and metal gate electrodes 370A and 370B of the metal gate stacks 300A and 300B in FIG. 3 are respectively similar to the interfacial layer 110, the dielectric layer 120, the first work function metal layer 130, the intermediate layer 140, the second work function layer 150 and the metal gate electrode 160 of the metal gate stack 100' of FIG. 1. A third work function metal layer 360A of the metal gate stack 300A includes the n-type work function metal, for example, aluminum (Al) and a compound of aluminum, e.g. aluminum oxide, aluminum nitride and any other suitable compounds. A third work function metal layer 360B of the metal gate stack 300B includes the p-type work function metal, for example, TaN, TiN, $TiNO_y$, $TaNO_y$, Al-doped TiN, W, or a combination thereof, and y>0. Furthermore, a fourth work function metal layer 362 may be disposed over the third work function metal layer 360B of the metal gate stack 300B, and the fourth work function metal layer 362 may be formed by the similar material as the third work function metal layer 360A of the metal gate stack 300A.

In some embodiments, the metal gate stack 300A may be used to form a n-type metal device, for example, a NMOS device. In other embodiments, the metal gate stack 300B may be used to form a p-type device, for example, a PMOS device. In a further embodiment, the device 300 may be a CMOS device (e.g. a statistic random access memory (SRAM)).

The metal gate stack 300B has a thicker (or greater amounts of) p-type work function metal (PWFM) layers than the metal gate stack 300A. However, the number of the PWFM layers shown in FIG. 3 is only for convenience of descriptions, and is not intended to limit the scope of the present disclosure. In a further example, the metal gate stack 300B may have the structure shown in FIG. 2. In other embodiments, the metal gate stack 300B may include a first PWFM layer 330B, a second PWFM layer 350B and two third PWFM layers 360B, and the intermediate layer 340B disposed between the first PWFM layer 330B and the second PWFM layer 350B. In another embodiment, the metal gate stack 300B may include a first PWFM layer 330B, a second PWFM layer 350B and three third PWFM layers 360B, and the intermediate layer 340B disposed between the first PWFM layer 330B and the second PWFM layer 350B. The embodiment of FIG. 3 shows the n-type work function metal (NWFM) layer 362 disposed on the third PWFM layers 360B of the metal gate stack 300B, however, it is not necessary for the p-type metal gate stack to have the NWFM layer. In the embodiments where the metal gate stack 300B includes two or three third PWFM layers 360B, the metal gate stack 300A may further include a third PWFM layer between the second PWFM layer 350A and the NWFM layer 360A, or the metal gate stack 300A may include plural first PWFM layers 330A.

Figure 4A:
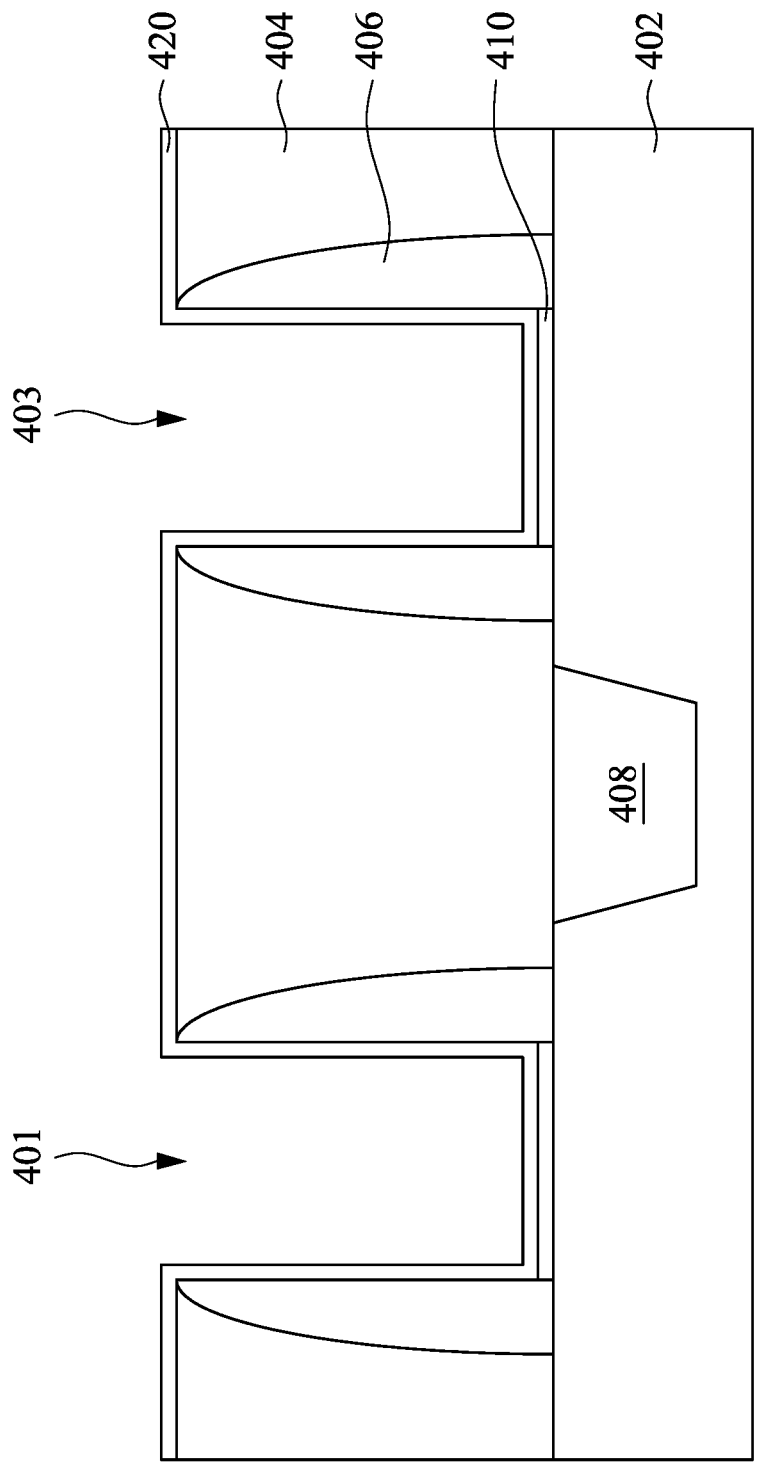
FIG. 4A through FIG. 4I are cross-sectional views of various intermediate stages showing a method of forming a semiconductor device in accordance with some embodiments of the present disclosure.

Referring to FIG. 4A through FIG. 4I, FIG. 4A through FIG. 4I are cross-sectional views of various intermediate stages showing a method of forming a device in accordance with some embodiments of the present disclosure. As shown in FIG. 4A, a substrate 402 is provided, and a STI 408 is formed in the substrate 402. Typically, dummy gate stacks (not shown) are formed on the substrate 402 and isolated by the STI 408, in which the dummy gate stacks are formed by a series of deposition processes and patterning processes. The dummy gate stacks are located at the position of trenches 401 and 403 formed later, as shown in FIG. 4A. Gate spacers 406 are formed on sidewalls of each of the dummy gate stacks, in which the formation of the gate spacers 406 may include a dielectric deposition process, an anisotropic etching process and a planarization process. Then, an inter-layer dielectric (ILD) layer 404 may be formed on the substrate 402. For example, the ILD layer 404 may be formed using flowable chemical vapor deposition (FCVD) or spin-on coating. Next, removing the dummy gate stacks, thereby forming the trenches 401 and 403 in the ILD layer 404, as shown in FIG. 4A. Then, an interfacial layer 410 and a dielectric layer 420 are formed in each of the trenches 401 and 403. In some embodiments, the interfacial layer 410 may be formed through thermal oxidation process, a chemical oxidation, or a deposition process. In some embodiments, the dielectric layer 420 may be formed by an atomic layer deposition (ALD) process, a chemical vapor deposition (CVD) process, or the like. In some embodiments, the substrate 402, the ILD layer 404, the gate spacers 406, the interfacial layer 410 and the dielectric layer 420 are respectively same as the substrate 102, the ILD layer 104, the gate spacers 106, the interfacial layer 110 and the dielectric layer 120 in FIG. 1. The formation of the intermediate structure of FIG. 4A is known to a person skilled in the art, and may not be further described herein.

Figure 4B:
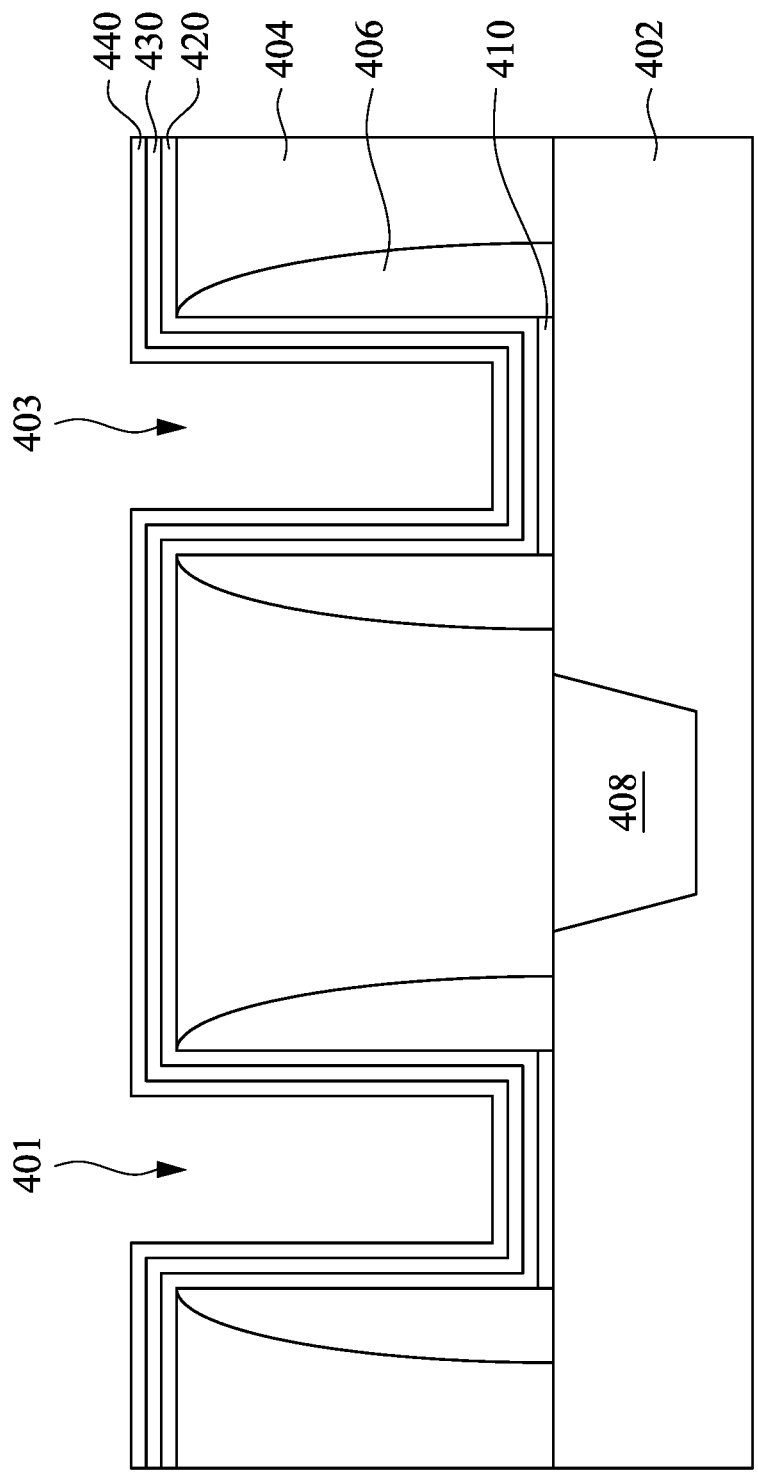

Next, as shown in FIG. 4B, a first work function metal layer 430 is deposited over the dielectric layer 420, followed by depositing a dummy layer 440 over the first work function metal layer 430. In some embodiments, the first work function metal layer 430 has an etch selectivity different from that of the dummy layer 440. The first work function metal layer 430 and the dummy layer 440 include different p-type work function metal materials. In some embodiments, the material of the first work function metal layer 430 includes TiN, $TiNO_y$, $TaNO_y$, Al-doped TiN, or a combination thereof, and y>0. In some embodiments, the material of the dummy layer 440 includes TaN, W or a nitride compound containing Ti and Ta.

Figure 4C:
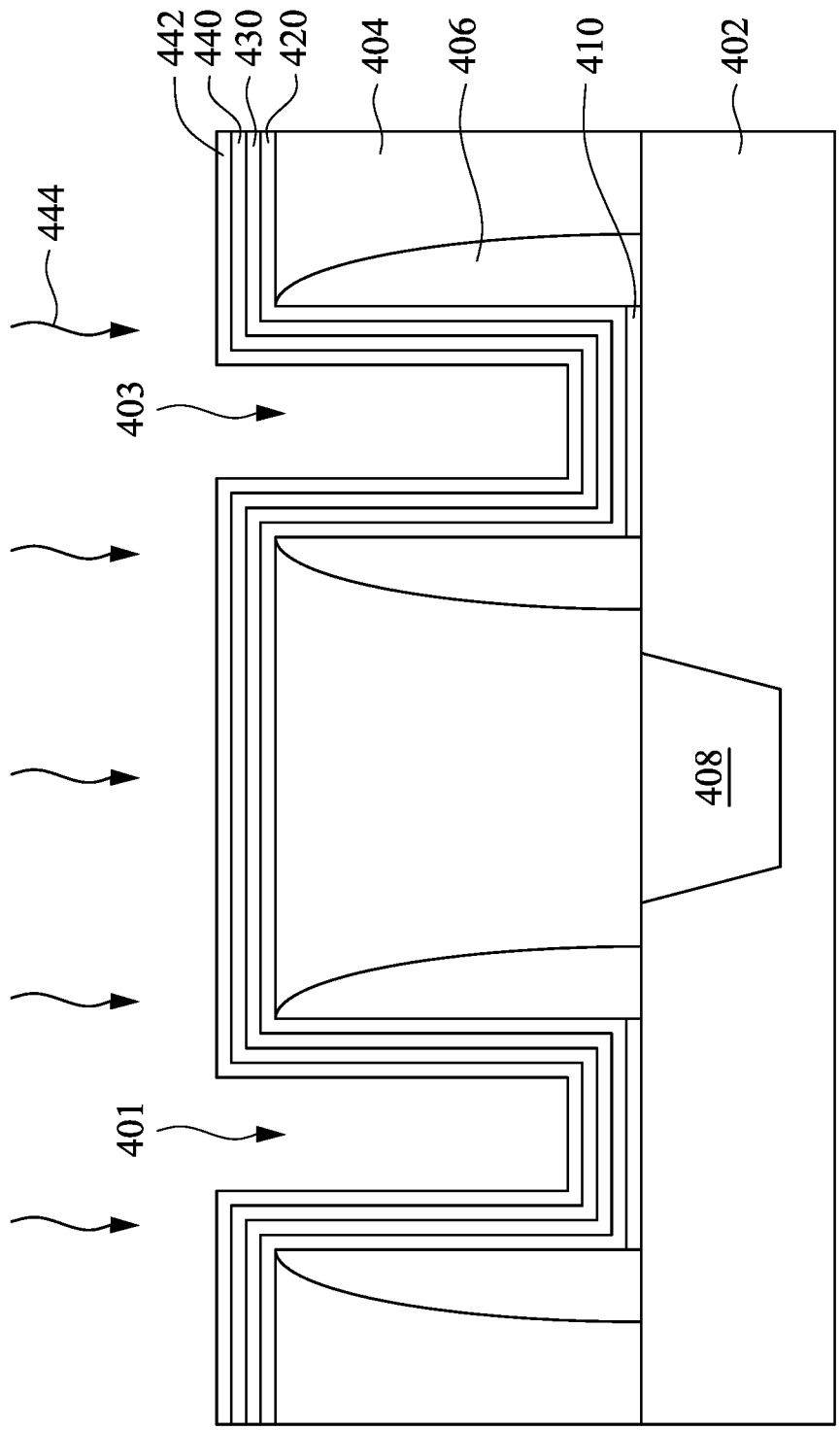
Figure 4C:
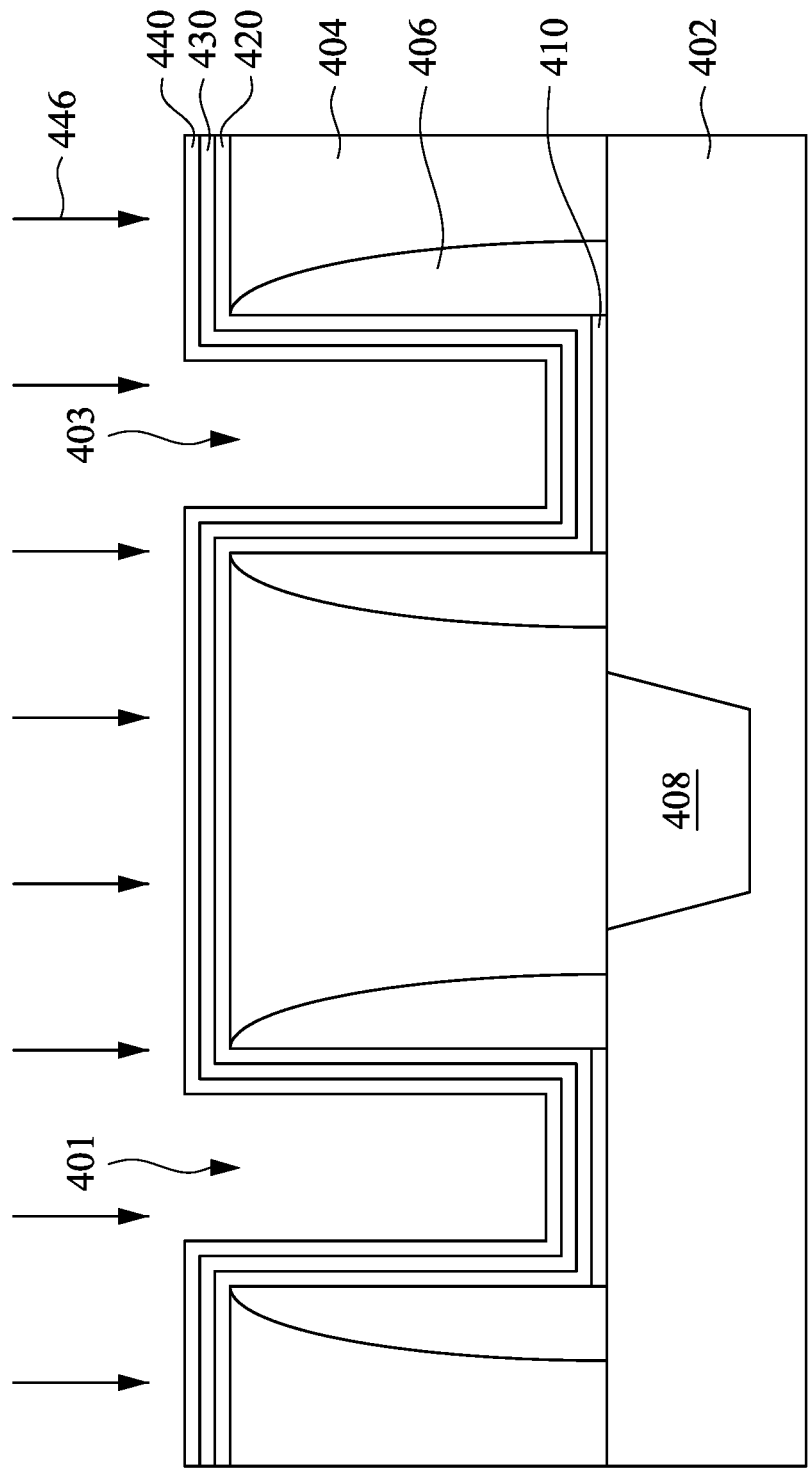
Figure 4D:
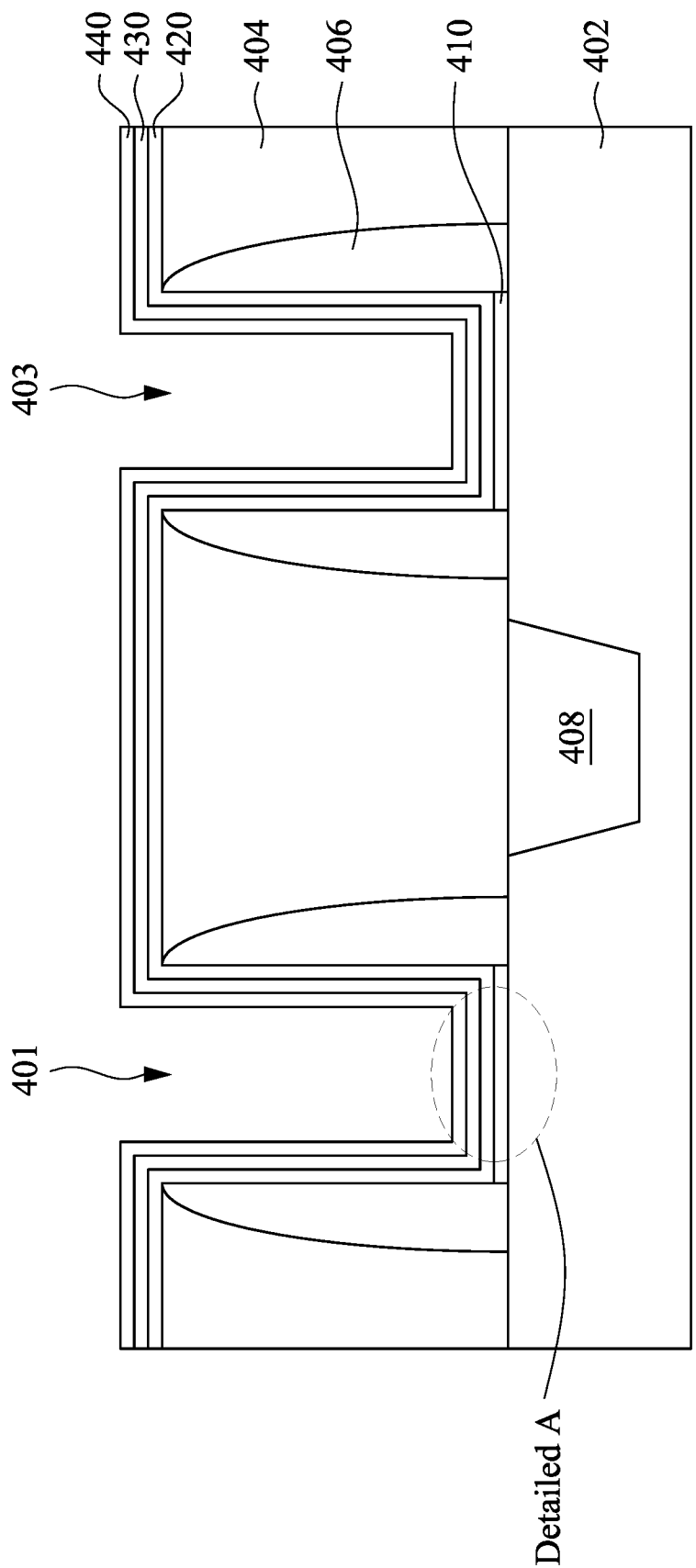

Then, an impurity is introduced into the first work function metal layer 430, such that a work function of the first work function metal layer 430 may be adjusted. In the embodiment of FIG. 4C, introducing the impurity is performed by depositing a work function adjusting layer 442 over the dummy layer 440, followed by annealing the work function adjusting layer 442 to diffuse the impurity into at least one of the dummy layer 440 and the first work function metal layer 430, such as an operation 444 shown in FIG. 4C. The impurity may be further introduced into the dielectric layer 420. The impurity is selected based on a predetermined work function, and there is no limitation of a species of the impurity in the present disclosure. After the annealing operation 444, the work function adjusting layer 442 is etched such that a top portion of the dummy layer 440 is etched, as shown in FIG. 4D and FIG. 4D'. In some embodiments, etching the work function metal adjusting layer is performed using a wet etching operation. When the work function adjusting layer 442 is etched, the dummy layer 440 is used as a protective layer (i.e. an etch stop layer) and directly contacts the etchant of the etching operation, causing damages or a loss of the dummy layer 440. For example, the top portion of the dummy layer 440 becomes uneven or rough in the enlarged FIG. 4D'.

In some embodiments, the operations of depositing, annealing and etching the work function metal adjusting layer 442, may be repeated for several times, so as to achieve a desired characteristic. The characteristic depends on a type of the semiconductor device, a target performance of the semiconductor device or any other conditions, and thus the present disclosure is not limited to any specific method for adjusting the work function. Any techniques known by a skilled person in the art to adjust the work function of the semiconductor device can be applied here.

In other embodiments, introducing the impurity is performed by implanting the impurity into the first work function metal layer 430, such as an operation 446 shown in FIG. 4C'. After the implanting operation 446, the top portion of the dummy 440 is also likely to be damaged, as shown in the enlarged FIG. 4D'.

Figure 4E:
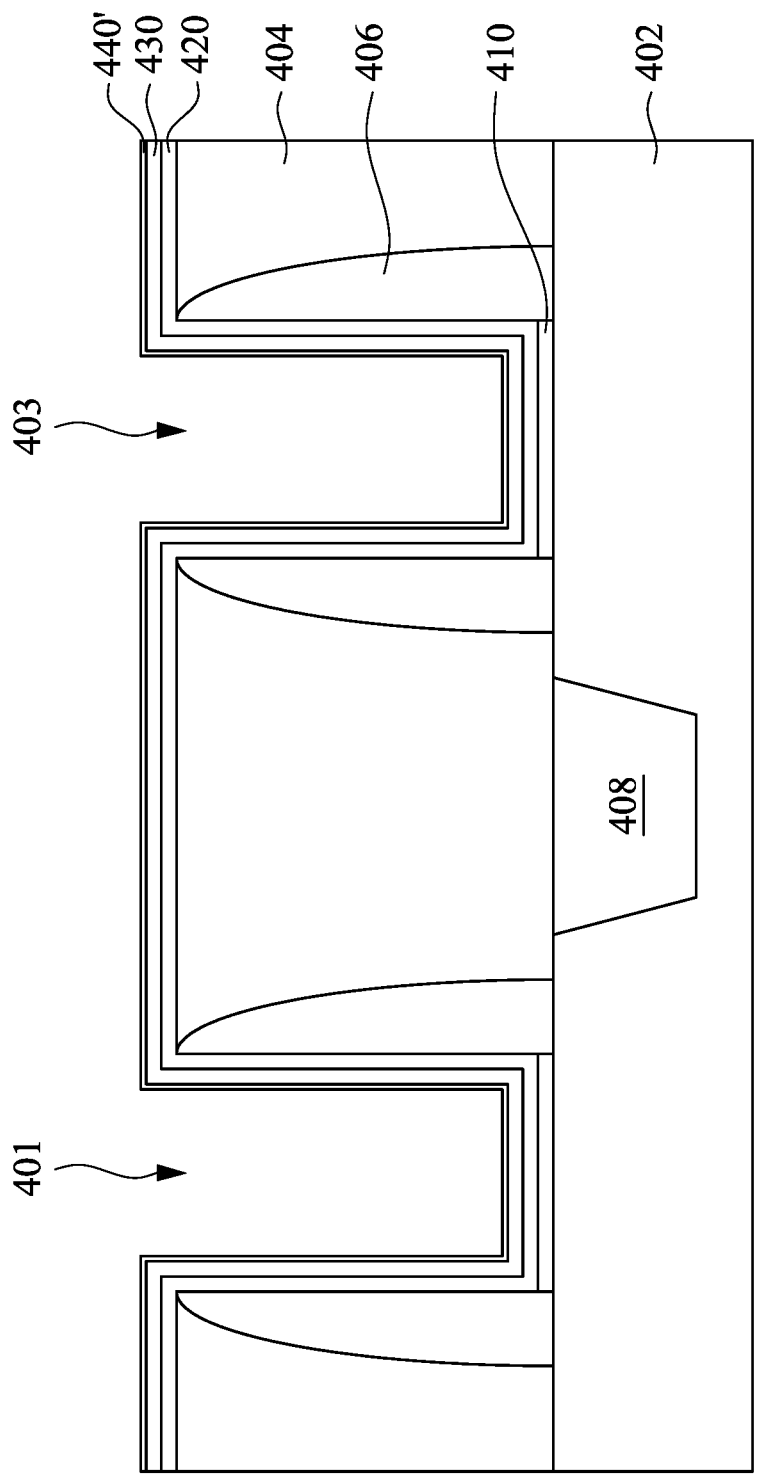

Typically, the damaged dummy layer 440 remains as one of the work function metal layers, and another work function metal layer(s) may then be directly deposited on the dummy layer 440. However, the formed semiconductor device may have a poor performance due to the damaged dummy layer 440. Therefore, as shown in FIG. 4E, the dummy layer 440 is removed, such that a W-containing residue 440' is formed over the first work function metal layer 430. In some embodiments, removing the dummy layer 440 is performed by a wet etching process using an etchant. In some embodiments, the etchant may include but is not limited to tungsten fluoride, tungsten chloride, a combination thereof, or any other suitable etchants. In some embodiments, the removal of the dummy layer 440 is performed by a dry etching operation. In some embodiments, the dummy layer 440 is partially removed. In some embodiments, the dummy layer 440 is completely removed. In some embodiments, the method further includes a cleaning operation to remove some byproducts formed during the removal of the dummy layer 440 while the W-containing residue 440' remains.

In some embodiments, the W-containing residue 440' is formed by a reaction between the etchant and the dummy layer 440. In some embodiments, the W-containing residue 440' includes a compound different from the first work function metal layer 430, such as a nitride compound of aluminum, tungsten, tantalum, or titanium. In some embodiments, the W-containing residue 440' includes at least one of a binary, ternary, and quaternary tungsten compound. In this embodiment, the W-containing residue 440' may include the compound of tungsten including but is not limited to, tungsten chloride, tungsten oxide, or a combination thereof. In a further embodiment, the W-containing residue 440' may be a remaining portion of the dummy layer 440, and thus the W-containing residue 440' may further include a compound of W and TiN, TaN, TiNOX and/or $TaNO_x$, or a combination thereof, and x>0. In some embodiments, the W-containing residue 440' has a thickness in a range from about 3 Å to about 10 Å. A greater thickness increases the difficulty of subsequent filling process, in some instances. A smaller thickness would damage the underlying layers, in some instances.

Figure 4F:
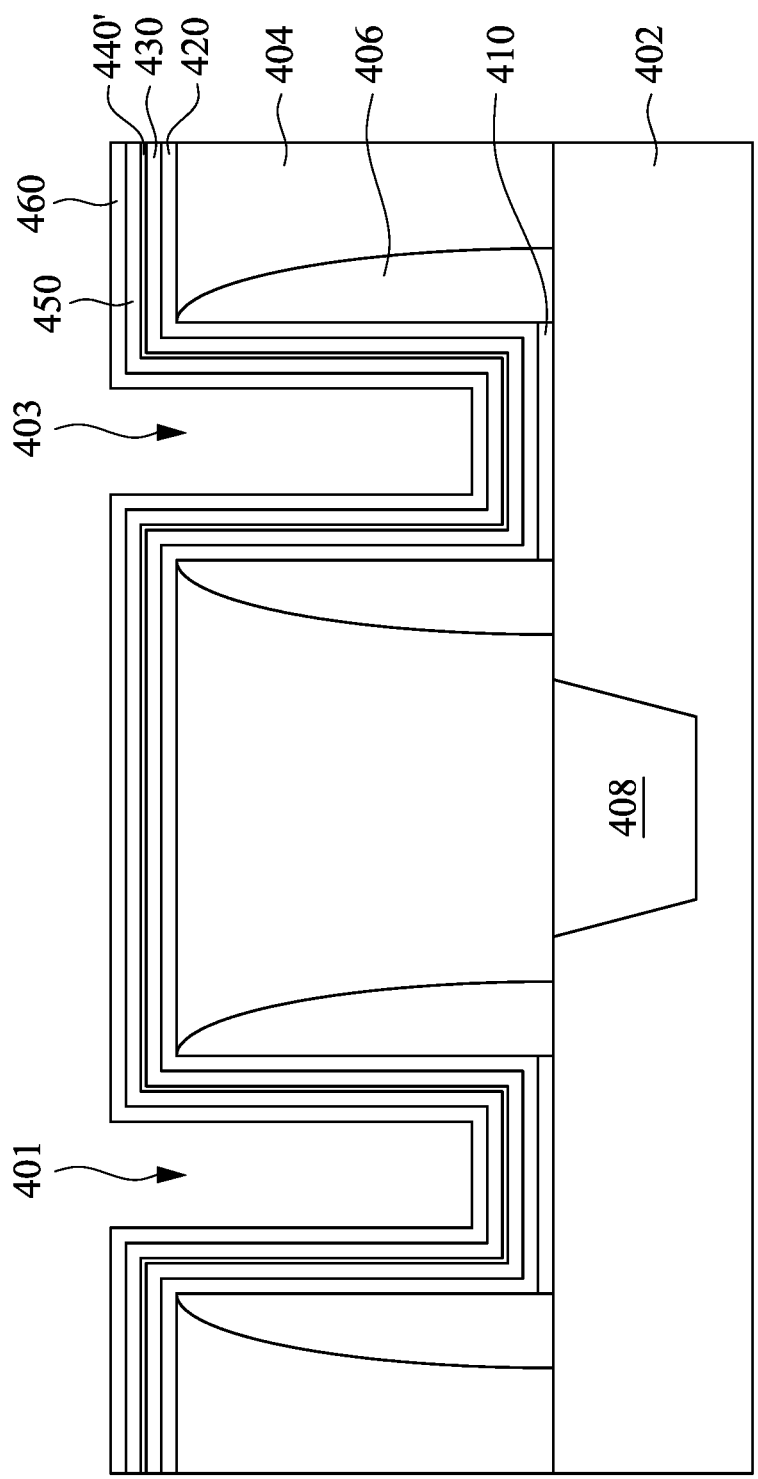

Then, as shown in FIG. 4F, a second work function metal layer 450 is deposited over the first work function metal layer 430 and the W-containing residue 440'. In some embodiments, depositing the second work function metal layer 450 is performed such that the W-containing residue 440' remains between the first work function metal layer 430 and the second work function metal layer 450 after depositing the second work function metal layer 450. In one embodiment, the second work function metal layer 450 includes a p-type work function metal, and the second work function metal layer 450 and the dummy layer 440 may include the same material. In other words, the formation of the second work function metal layer 450 may be referred to re-deposition of the dummy layer 440. In other embodiments, the second work function metal layer 450 may be formed by different materials from the dummy layer 440.

Still referring to FIG. 4F, a third work function metal layer 460 is deposited over the second work function metal layer 450 in some embodiments. The third work function metal layer 460 includes TaN, TiN, $TiNO_y$, $TaNO_y$, Al-doped TiN, W, or a combination thereof, and y>0. There is no limitation for the material of the third work function metal layer 460, for example, the third work function metal layer 460 is same as the first work function metal layer 430 in some embodiments. In other embodiments, the third work function metal layer 460 is same as the second work function metal layer 450. In a further embodiment, the third work function metal layer 460 is different from the first work function metal layer 430 and the second work function metal layer 450. In some embodiments, each of the first work function metal layer 430, the second work function metal layer 450 and the third work function metal layer 460 has a thickness in a range from about 5 Å to about 25 Å. In some embodiments, a thickness of the second work function metal layer 450 is in a range from about 5 Å to about 15 Å. When the thickness of the second work function metal layer 450 is out of the above range, the threshold voltage varies.

Figure 4G:
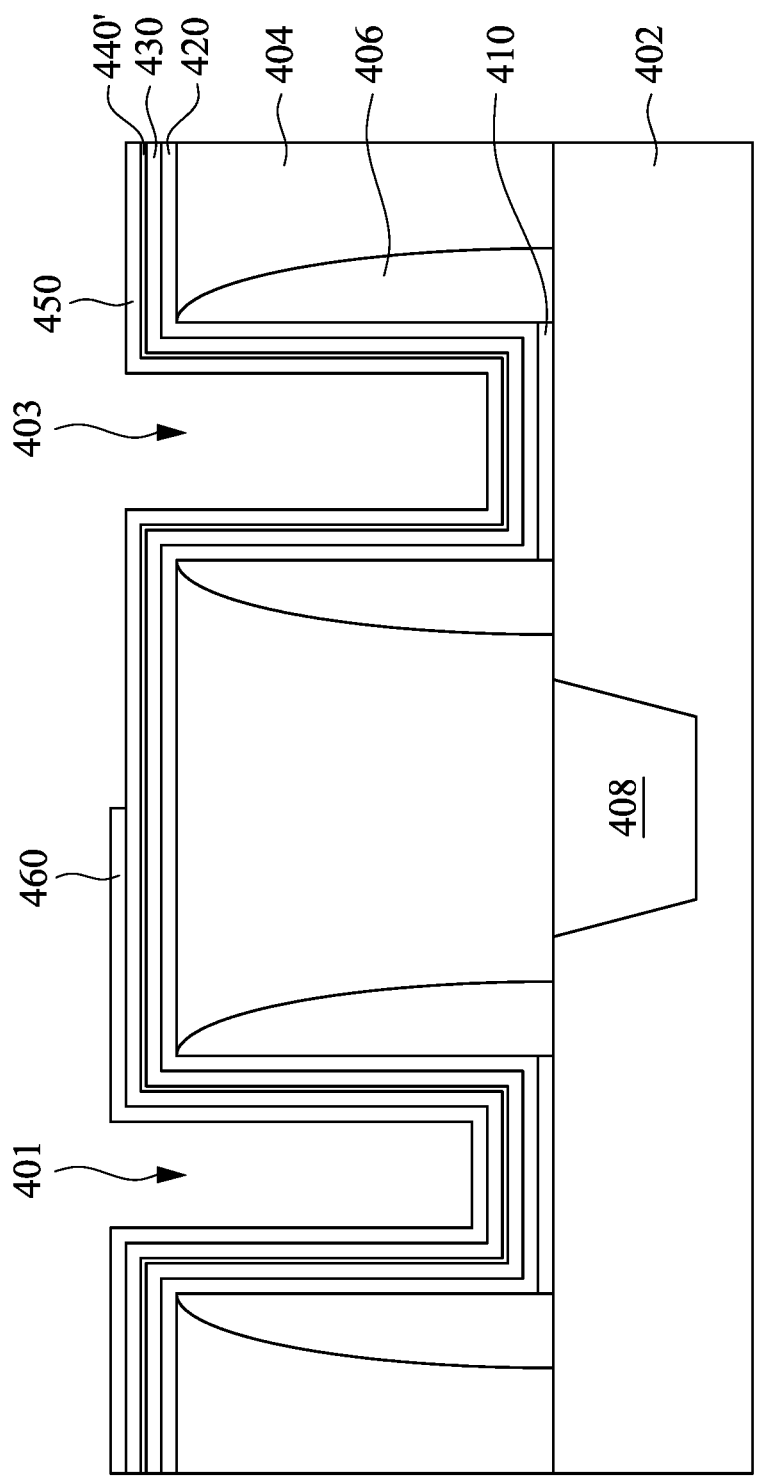
Figure 4H:
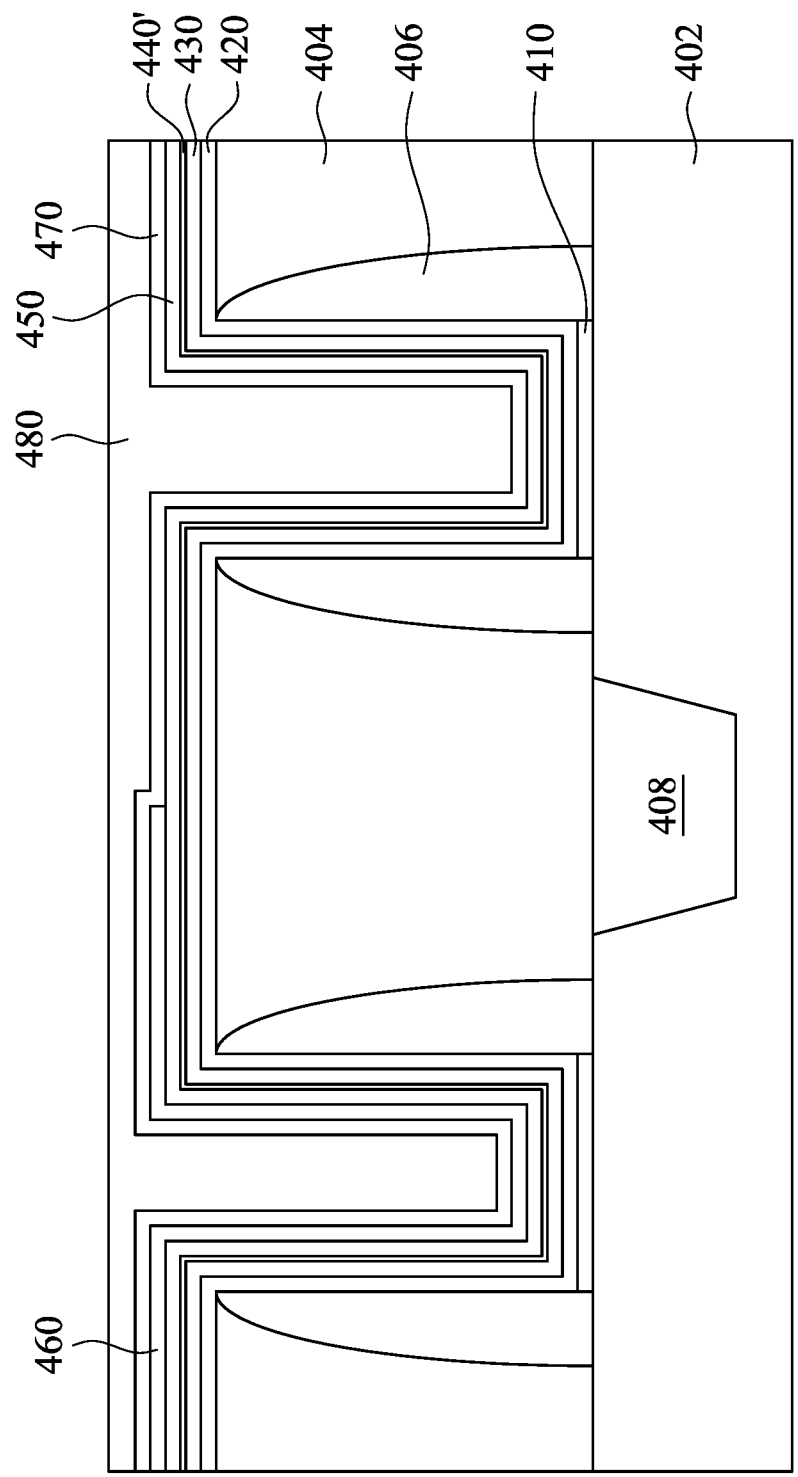

Next, as shown in FIG. 4G and FIG. 4H, a portion of the third work function metal layer 460 in the trench 403 and on the ILD layer 404 is removed, followed by depositing a fourth work function metal layer 470 in the trench 401 and trench 403 and on the ILD layer 404. During removing the portion of the third work function metal layer 460, the redeposited second work function metal layer 450 also acts as a barrier layer/protection layer. In some embodiments, the fourth work function metal layer 470 includes an n-type work function metal, such as aluminum (Al) and a compound of aluminum, e.g. aluminum oxide, aluminum nitride and any other suitable compounds. The removal of the portion of the third work metal function metal layer 460 may be performed by a N/P patterning process using a mask (not shown) formed over the trench 401. In the embodiments where the fourth work function metal layer 470 is not formed in the trench 401, the mask is also used in the deposition of the fourth work function metal layer 470. The N/P patterning process is known by a skilled person in the art and may not be further described herein. In some embodiments, the formation of the first work function metal layer 430, the dummy layer 440, the second work function metal layer 450, the third work function metal layer 460 and the fourth work function metal layer 470 includes a deposition process and a patterning process. In some embodiments, the deposition process includes but is not limited to chemical vapor deposition (CVD), atomic layer deposition (ALD), physical vapor deposition (PVD), or any other suitable processes.

Figure 4I:
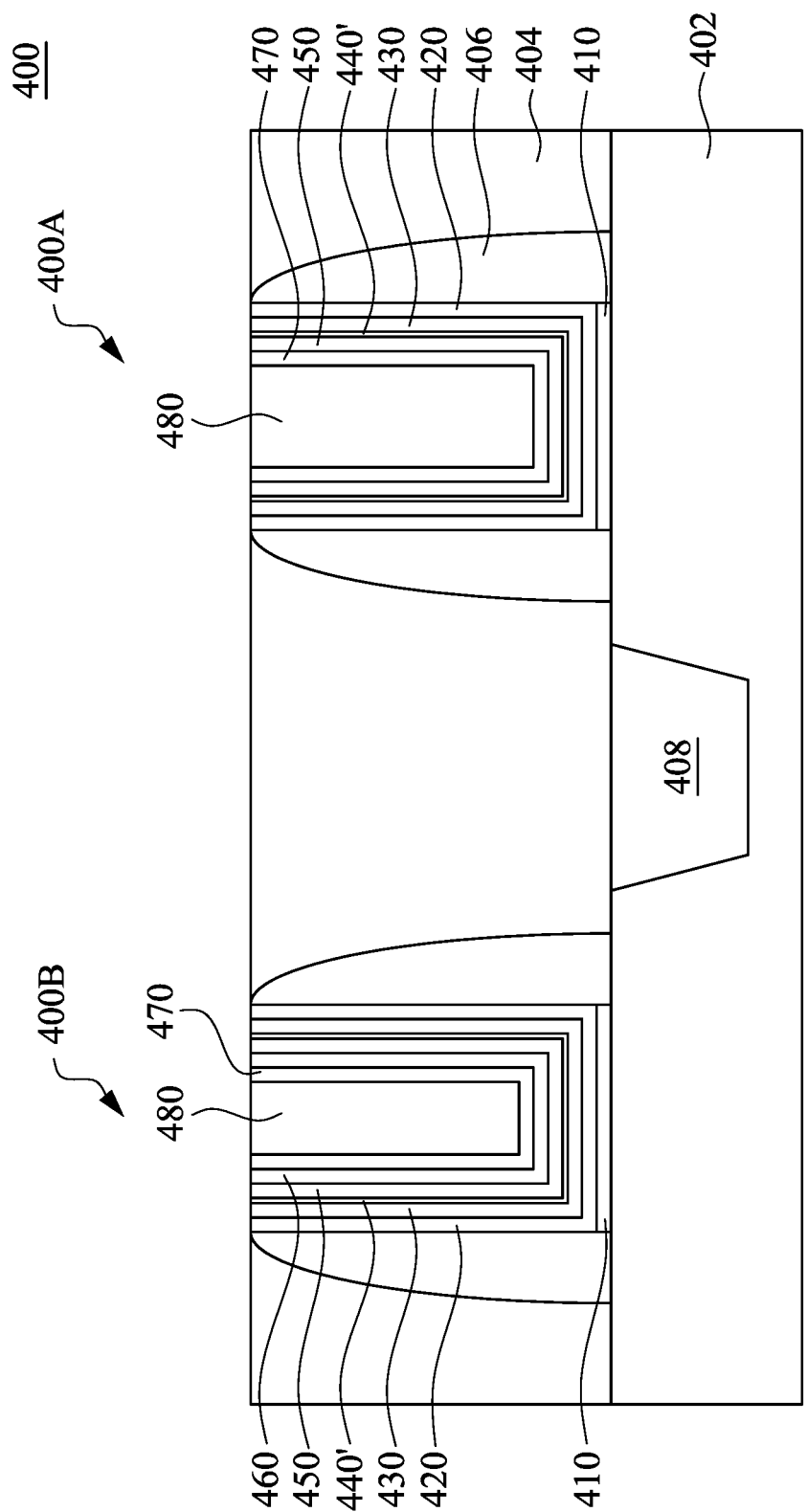

Still referring to FIG. 4H, a conductive material 480 is filled into the trenches 401 and 403. The conductive material 480 includes, for examples, aluminum, tungsten, copper. Then, as shown in FIG. 4I, a portion of the first work function metal layer 430, the W-containing residue 440', the second work function metal layer 450, the third work function metal layer 460, the fourth work function metal layer 470 and the conductive material 480 on the ILD layer 404 are removed, and a device 400 is formed. The device 400 includes an n-type device 400A and a p-type device 400B. The removal of the above portions may be performed by a planarization operation, such as chemical mechanical planarization (CMP).

Figure 5:
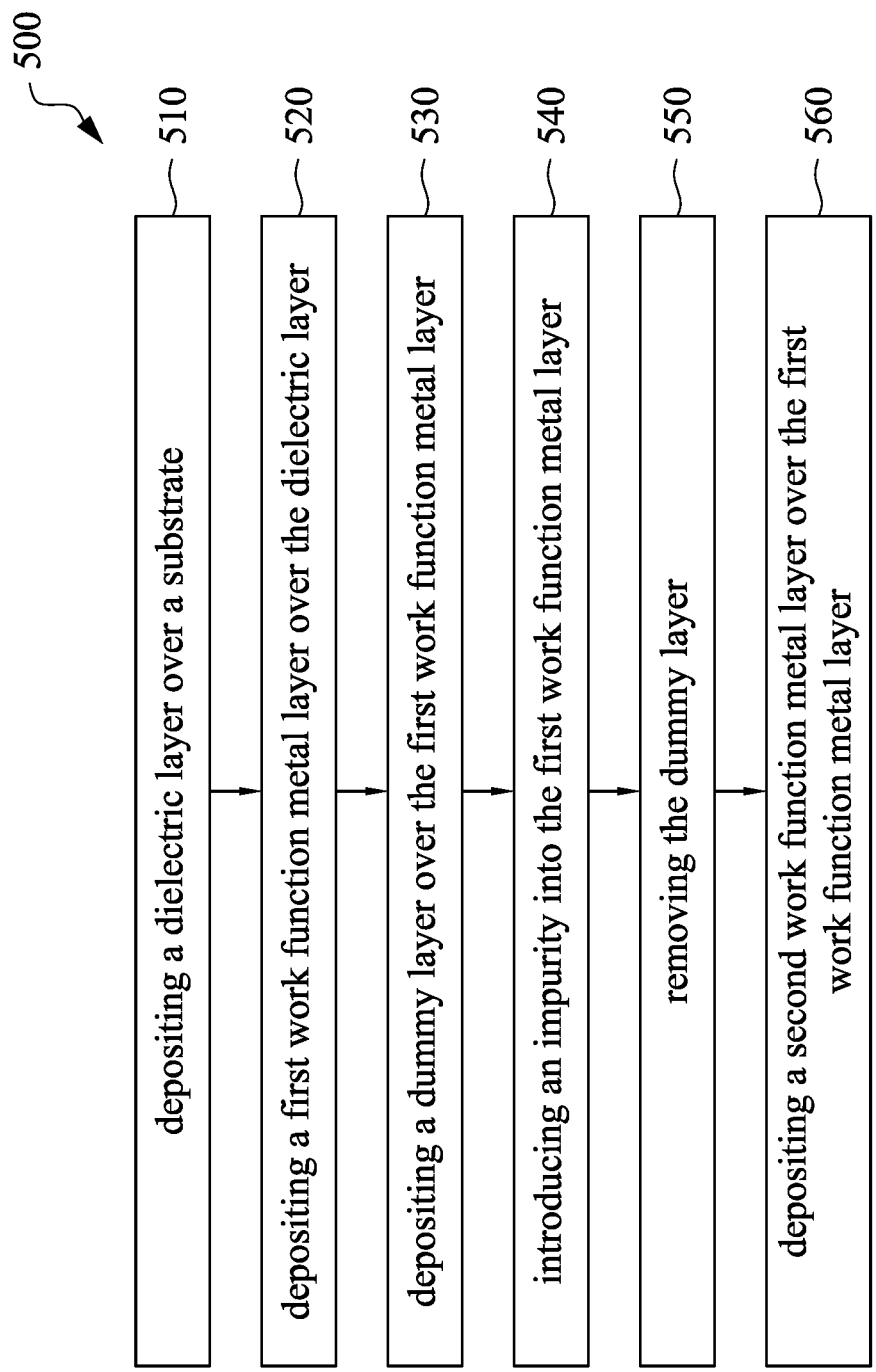
FIG. 5 is a flowchart showing a method of forming a device in accordance with some embodiments of the present disclosure.

FIG. 5 is a flowchart showing a method 500 of forming a device in accordance with some embodiments of the present disclosure. FIG. 4A through FIG. 4I are incorporated as a reference for clear understanding.

At operation 510, a dielectric layer 420 is deposited over a substrate 402, as shown in FIG. 4A. At operation 520, a first work function metal layer 430 is deposited over the dielectric layer 420, as shown in FIG. 4B. Then, at operation 530, a dummy layer 440 is deposited over the first work function metal layer 430, as shown in FIG. 4B. Next, at operation 540, an impurity is introduced into the first work function metal layer 430, as shown in FIG. 4C, FIG. 4C', FIG. 4D and FIG. 4D'. At operation 550, the dummy layer 440 is removed, as shown in FIG. 4E. At operation 560, a second work function metal layer 450 is deposited over the first work function metal layer 430, as shown in FIG. 4F. The method may further include depositing a third work function metal layer 460, as shown in FIG. 4F. A portion of the third work function layer 460 is removed, and a fourth work function metal layer 470 and a conductive material 480 are sequentially deposited, as shown in FIG. 4G and FIG. 4H. Then, portions of the first, second, third and fourth work function metal layers 430, 450, 460 and 470, the W-containing residue 440' and the conductive material 480 are planarized, thereby forming the device 400 shown in FIG. 4I.

Figure 6:
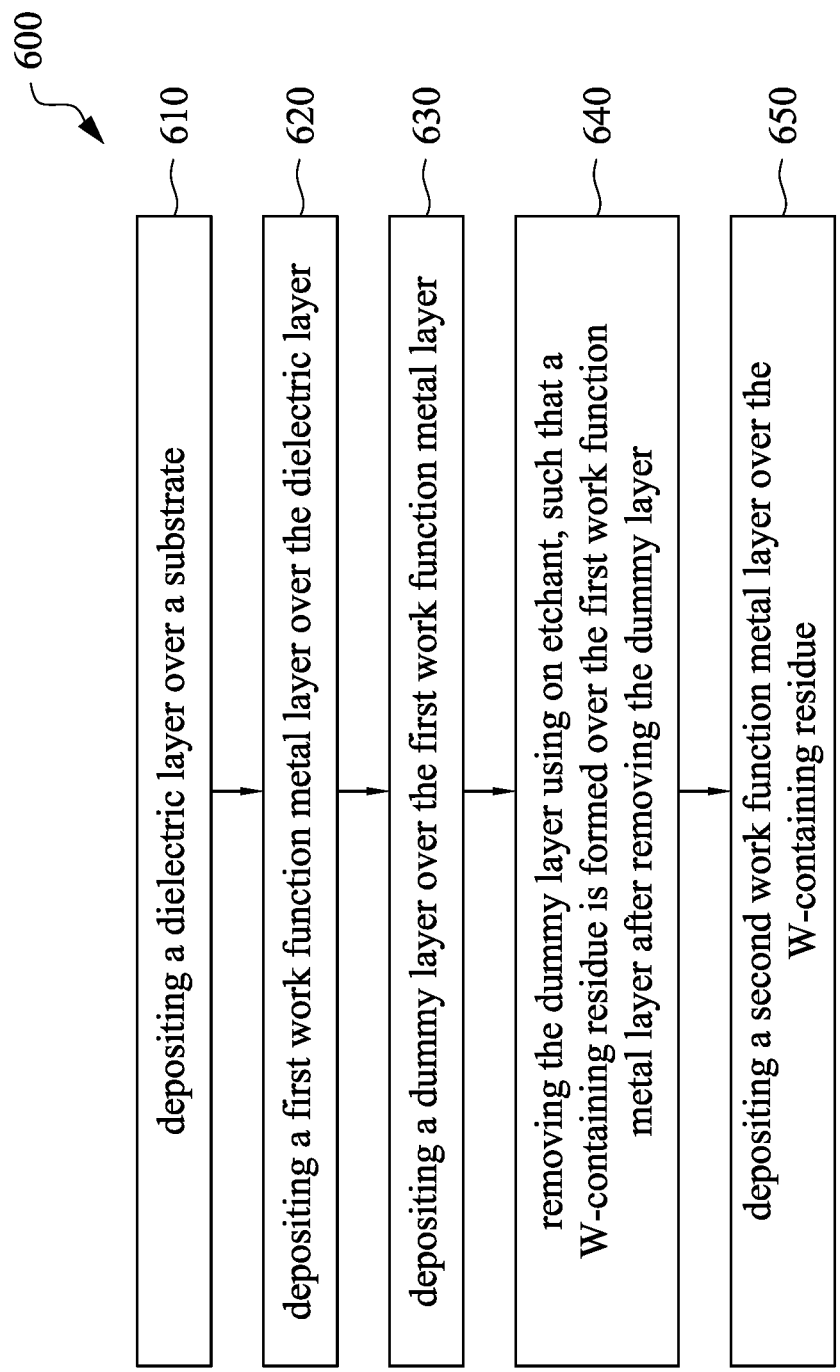
FIG. 6 is a flowchart showing a method of forming a device in accordance with some embodiments of the present disclosure.

FIG. 6 is a flowchart showing a method 600 of forming a device in accordance with some embodiments of the present disclosure. FIG. 4A through FIG. 4I are incorporated as a reference for clear understanding.

At operation 610, a dielectric layer 420 is deposited over a substrate 402, as shown in FIG. 4A. At operation 620, a first work function metal layer 430 is deposited over the dielectric layer 420, as shown in FIG. 4B. Then, at operation 630, a dummy layer 440 is deposited over the first work function metal layer 430, as shown in FIG. 4B. At operation 640, the dummy layer 440 is removed using an etchant, such that a W-containing residue 440' is formed over the first work function metal layer 430 after removing the dummy layer 440, as shown in FIG. 4C through FIG. 4E. At operation 650, a second work function metal layer 450 is deposited over the W-containing residue 440', as shown in FIG. 4F. The method may further include depositing a third work function metal layer 460, as shown in FIG. 4F. A portion of the third work function layer 460 is removed, and a fourth work function metal layer 470 and a conductive material 480 are sequentially deposited, as shown in FIG. 4G and FIG. 4H. Then, portions of the first, second, third and fourth work function metal layer 430, 450, 460 and 470, the W-containing residue 440' and the conductive material 480 are planarized, thereby forming the device 400 shown in FIG. 4I.

The method of forming the device is provided in the present disclosure. The method mainly includes removing the damaged dummy layer and re-depositing another new layer (i.e. the second work function metal layer) that is similar to (e.g. having the same composition) the dummy layer. Therefore, the device formed by the method may include the W-containing layer, which is a residue layer of the dummy layer. The method has benefits such as no need of an additional mask, being compatible to the current semiconductor manufacturing process, less device defects (e.g. N/P boundary concern), so as to form the semiconductor device having a higher yield and a better performance.

According to some embodiments, a method includes removing a dummy gate to form a gate trench. A gate dielectric layer is deposited over a bottom and sidewalls of the gate trench. A first work function metal layer is deposited over the gate dielectric layer. A dummy layer is deposited over the first work function metal layer. An impurity is introduced into the dummy layer and the first work function metal layer after the dummy layer is deposited. The dummy layer is removed after the impurity is introduced into the dummy layer and the first work function metal layer. The gate trench is filled with a conductive material after the dummy layer is removed.

According to some embodiments, a method includes removing a dummy gate to form a gate trench. A gate dielectric layer is deposited over a bottom and sidewalls of the gate trench. A first work function metal layer is deposited over the gate dielectric layer. A dummy layer is deposited over the first work function metal layer. A work function adjusting layer is deposited over the dummy layer. The work function adjusting layer is annealed. The work function adjusting layer is removed after the work function adjusting layer is annealed. The dummy layer is removed after the work function adjusting layer is removed. The gate trench is filled with a conductive material after the dummy layer is removed.

According to some embodiments, a device includes a gate electrode, a first work function metal layer, a gate dielectric layer, and a tungsten-containing material. The first work function metal layer wraps around the gate electrode. The gate dielectric layer wraps around the first work function metal layer. The tungsten-containing material is between the gate electrode and the first work function metal layer and is spaced apart from the gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   removing a dummy gate to form a gate trench;
   depositing a gate dielectric layer over a bottom and sidewalls of the gate trench;
   depositing a first work function metal layer over the gate dielectric layer;
   depositing a dummy layer, made of tantalum nitride (TaN), over the first work function metal layer;
   introducing an impurity into the dummy layer and the first work function metal layer after depositing the dummy layer;
   removing the dummy layer after introducing the impurity into the dummy layer and the first work function metal layer; and
   filling the gate trench with a conductive material after removing the dummy layer.

2. The method of claim 1, further comprising:
   depositing a second work function metal layer over the first work function metal layer after removing the dummy layer.

3. The method of claim 2, wherein depositing the second work function metal layer is performed such that the second work function metal layer is spaced apart from the first work function metal layer.

4. The method of claim 1, wherein the dummy layer and the first work function metal layer comprise different materials.

5. The method of claim 1, wherein removing the dummy layer is performed such that a tungsten-containing material remains over the first work function metal layer after removing the dummy layer.

6. The method of claim 1, wherein introducing the impurity into the dummy layer and the first work function metal layer comprises:
   depositing a work function adjusting layer over the dummy layer; and
   annealing the work function adjusting layer such that the impurity diffuses from the work function adjusting layer into the dummy layer and the first work function metal layer.

7. The method of claim 6, wherein annealing the work function adjusting layer is performed such that the impurity diffuses into the gate dielectric layer.

8. The method of claim 1, wherein introducing the impurity into the dummy layer and the first work function metal layer comprises:
   implanting the impurity into the dummy layer and the first work function metal layer with the dummy layer exposed.

9. A method, comprising:
   removing a dummy gate to form a gate trench;
   depositing a gate dielectric layer over a bottom and sidewalls of the gate trench;
   depositing a first work function metal layer over the gate dielectric layer;
   depositing a dummy layer over the first work function metal layer;
   depositing a work function adjusting layer over the dummy layer;
   annealing the work function adjusting layer;
   removing the work function adjusting layer after annealing the work function adjusting layer;
   removing the dummy layer after removing the work function adjusting layer; and
   filling the gate trench with a conductive material after removing the dummy layer.

10. The method of claim 9, wherein removing the dummy layer is performed by using an etchant comprising tungsten halide.

11. The method of claim 9, wherein removing the dummy layer is performed by using an etchant, removing the dummy layer is performed such that the etchant reacts with the dummy layer to form an tungsten compound, and the tungsten compound remains over the first work function metal layer after removing the dummy layer.

12. The method of claim 11, further comprising:
   depositing a second work function metal layer over the tungsten compound.

13. The method of claim 12, wherein the tungsten compound and the second work function metal layer comprise different materials.

14. The method of claim 9, further comprising:
   repeating depositing, annealing, and removing the work function adjusting layer to adjust a work function of the first work function metal layer.

15. The method of claim 14, wherein removing the dummy layer is performed after repeating depositing, annealing, and removing the work function adjusting layer.

16. A device, comprising:
   a gate electrode;
   a first work function metal layer wrapping around the gate electrode;
   a gate dielectric layer wrapping around the first work function metal layer; and
   a tungsten-containing material between the gate electrode and the first work function metal layer and spaced apart from the gate electrode.

17. The device of claim 16, further comprising:
   a second work function metal layer between the tungsten-containing material and the gate electrode.

18. The device of claim 17, wherein the second work function metal layer and the first work function metal layer comprise different materials.

19. The device of claim 17, wherein the tungsten-containing material is in contact with the second work function metal layer.

20. The device of claim 16, wherein the tungsten-containing material is in contact with the first work function metal layer.

* * * * *